(12) United States Patent
Franz et al.

(10) Patent No.: US 10,955,883 B1
(45) Date of Patent: Mar. 23, 2021

(54) POWER SUPPLY DRY DISCONNECT LIQUID COOLING

(71) Applicant: HEWLETT PACKARD ENTERPRISE DEVELOPMENT LP, Houston, TX (US)

(72) Inventors: John Franz, Houston, TX (US); Robert Mascia, Chippewa Falls, WI (US); Harvey Lunsman, Chippewa Falls, WI (US); Steven Dean, Chippewa Falls, WI (US); Michael Scott, Chippewa Falls, WI (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days.

(21) Appl. No.: 16/653,335

(22) Filed: Oct. 15, 2019

(51) Int. Cl.
| | | |
|---|---|---|
| *G06F 1/20* | (2006.01) | |
| *G06F 1/26* | (2006.01) | |
| *H05K 7/20* | (2006.01) | |

(52) U.S. Cl.
CPC .............. *G06F 1/20* (2013.01); *G06F 1/26* (2013.01); *H05K 7/20254* (2013.01); *H05K 7/20272* (2013.01); *H05K 7/20927* (2013.01); *G06F 2200/201* (2013.01)

(58) Field of Classification Search
CPC .......... H01L 2924/0002; H01L 23/473; H01L 23/427; H01L 23/3672; H01L 23/34; H01L 23/40; H05K 7/20772; H05K 7/20781; H05K 7/20254; H05K 7/20509; H05K 7/20272; H05K 7/20927; G06F 1/20; G06F 2200/201; G06F 1/206; G06F 1/181; G06F 1/187; G06F 1/189; G06F 1/266; G06F 1/26; F28D 2021/0029
USPC .............. 361/699, 689, 700, 679.47, 679.46, 361/679.54, 702; 165/104.33, 170, 80.4
See application file for complete search history.

(56) References Cited

U.S. PATENT DOCUMENTS

| | | |
|---|---|---|
| 5,473,506 A | 12/1995 | Kikinis |
| 6,784,837 B2 | 8/2004 | Revankar et al. |
| 6,989,990 B2 | 1/2006 | Malone et al. |
| 7,133,285 B2 | 11/2006 | Nishimura |
| 7,961,465 B2 | 6/2011 | Goldrian et al. |
| 8,879,257 B2 | 11/2014 | Campbell et al. |
| 9,185,830 B2 | 11/2015 | Chainer et al. |
| 9,435,590 B2 | 9/2016 | Stellman |
| 10,058,009 B2 | 8/2018 | Huang et al. |
| 2017/0142864 A1 | 5/2017 | Chanu et al. |
| 2018/0307283 A1* | 10/2018 | Dupont ..................... G06F 1/20 |
| 2019/0045656 A1 | 2/2019 | Chen et al. |

* cited by examiner

*Primary Examiner* — Mandeep S Buttar
(74) *Attorney, Agent, or Firm* — Nolle Lackenbach Siegel

(57) ABSTRACT

A computing apparatus includes an enclosure to house computing nodes; a slot to receive a power supply unit that is to provide power to the computing nodes; and a cold plate assembly positioned in the slot. The cold plate assembly includes a first thermal exchange surface and a cooling loop. The first thermal exchange surface is inclined relative to a horizontal dimension of the slot and is to make thermal contact with a complementary thermal exchange surface of the power supply unit when the power supply unit is received by the slot, the complementary thermal exchange surface also being inclined relative to a horizontal dimension of the slot. The cooling loop is thermally coupled to the first interface and through which liquid coolant is to flow.

28 Claims, 11 Drawing Sheets

POWER SUPPLY DRY DISCONNECT LIQUID COOLING

BACKGROUND

One of the issues with the design of a computing device is heat management. Many computing devices contain a number of electronic components that generate heat during operation. Over time, this heat can accumulate and, eventually, become deleterious to the proper and/or efficient operation of the computing device. Furthermore, as computing technology evolves to become more powerful and capable, computing devices continue to include higher numbers of heat-generating electronic components that frequently operate at higher temperatures. This evolution exacerbates the heat management problems.

The art has therefore developed a number of techniques for managing heat by trying to remove it from the computing device. One common solution is to employ fans to circulate air through the computing device. Heat is transferred to the air and, as the air is circulated through and out of the computing device, the air removes the heat from the computing device. The art calls such a computing device an "air-cooled" computing device. More recently, the art has begun implementing "liquid cooled" approaches as well as hybrid "air-cooled" and "liquid cooled" approaches.

BRIEF DESCRIPTION OF THE DRAWINGS

The invention may be understood by reference to the following description taken in conjunction with the accompanying drawings, in which like reference numerals identify like elements, and in which:

-FIG. 2D is inserted into a slot in which is positioned a cold plate assembly in accordance with one or more examples.

Figure 1:
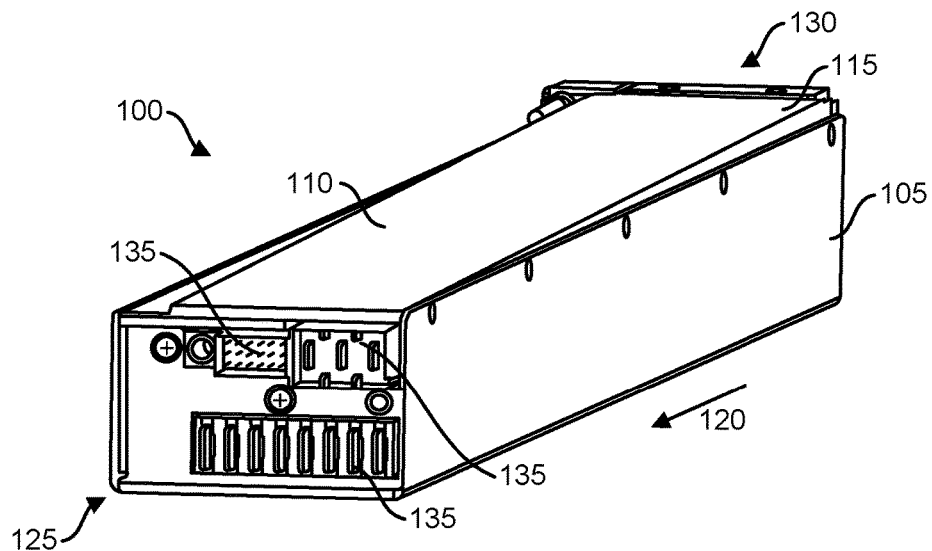
FIG. 1 is a rear perspective view of a pluggable computing apparatus power supply unit in accordance with one or more examples.

While the invention is susceptible to various modifications and alternative forms, the drawings illustrate specific examples herein described in detail by way of example. It should be understood, however, that the description of specific examples is not intended to limit the invention to the particular forms disclosed, but on the contrary, the intention is to cover all modifications, equivalents, and alternatives falling within the spirit and scope of the invention as defined by the appended claims.

DETAILED DESCRIPTION

While many of the liquid- and air-cooled approaches work satisfactorily, they do have issues. For example, in air-cooled approaches, air is circulated through the computing device by one or more fans. The air is typically directed within the computing device by a number of baffles to those portions of the computing device expected to generate the most heat. The air is cooled, or is at least at some ambient temperature, at the beginning of its circulation path through device. Heat is transferred to the air as it circulates. The heat transfer elevates temperature of the circulating air. By the time the air reaches the end of the circulation path, its temperature may be significantly higher than it was at the beginning. This rise in temperature accordingly may inhibit heat transfer at the end of the circulation path. Temperature differences may also yield significant variation from the beginning to the end of the circulation path with respect to the efficacy of the cooling provided.

Liquid-cooled approaches also have issues. One issue is the introduction of liquids to the environment in which electrical components are operating. While the liquid coolant is designed to be contained in conduits and dry disconnects can be used, they may nevertheless develop leaks over time. For example, a connector may be of faulty manufacture, become damaged or contaminated through use, or degrade over time. Leaks may result it in liquid coolant contaminating exterior connectors and circuit boards, for instance. The additional risk of short-circuiting the electronics can be overcome by using dielectric fluids, but other problems may arise.

Some computing devices are more susceptible to some of these issues than are others. One such computing device is a power supply unit. For instance, the fans in air-cooled systems can generate electromagnetic interference ("EMI") that distorts or otherwise interferes with electrical signals. While EMI distortion may be an issue for some computing devices, it is particularly a problem for power supply units because they are responsible for generating power signals used by other computing devices. Contamination or corruption of signals output by a power supply unit can therefore affect any number of computing devices besides the power supply unit.

Thus, according to the present disclosure, a pluggable, power supply unit interfaces with the liquid-cooling subsystem of a computing apparatus through a wedge-shaped mechanical contact with a cold plate of the liquid-cooling subsystem. The power supply unit may define a thermal exchange surface through an inclined face defined by the geometry of its case. The cold plate defines another thermal exchange surface through another inclined face whether through the geometry of the plate or through positional deformation. As the component (e.g., power supply unit) is inserted into a slot defined in the enclosure of the computing apparatus, the thermal exchange surfaces mechanically engage in a dry, metal-to-metal contact without any thermal interface material ("TIM"). The power supply unit is inserted until it is "wedged" into the slot and a retention mechanism is engaged. The insertion may also effectuate the electrical connection through a blind-mating as described below.

The power supply unit is liquid-cooled through the cold plate to the exclusion of air cooling. To facilitate heat transfer from the heat generating electronic components of the power supply unit, a thermal potting material is laid in a conformal layer over the heat generating electronic components. The conformal layer is poured or injected into the ullage of the case until it is thick enough to substantially fill the ullage. In the context of this disclosure, "substantially filled" means the thermal potting material sufficiently contacts not only with the heat generating electronic components but also the case and the heat sink or elements thereof. The volume of material required to "substantially fill" the air cavity and thermally link the heat generating electronic components to the conductive surfaces of the case for heat transfer is determined through analysis and experimentation depending on the component placement, power dissipated and geometry.

In some of these examples, the case is constructed from an anodized aluminum. The aluminum saves weight and conducts heat more effectively than, for instance, stainless steel. The anodization inhibits galvanic corrosion caused by contact with a different metal from which the cold plate is constructed.

In some examples, the cold plate defines the inclined face of the thermal exchange surface through its geometry. In some other examples, the cold plate is designed for positional deformation as it engages the inclined face of the pluggable, power supply unit. That is, the cold plate is designed to move, change, or shift position, as it engages the power supply unit. The cold plate may be biased in a first position by a biasing element such as a spring mechanism of some kind. The biasing element is overcome as the pluggable, heat-generating element is inserted into the slot. In still other examples, the cold plate may define the inclined face of the thermal exchange surface both through its geometry and through positional deformation. The cold plate and the supply and return conduits may be constructed from Copper or some other suitable material. Copper is an example of a "soft" or ductile metal that, in addition to be a good heat conductor, can also deform to some degree to accommodate the insertion of the pluggable, power supply unit.

Thus, according to one or more examples disclosed herein, a computing apparatus comprises an enclosure to house computing nodes; a slot to receive a power supply unit that is to provide power to the computing nodes; and a cold plate assembly positioned in the slot. The cold plate assembly includes a first thermal exchange surface and a cooling loop. The first thermal exchange surface is inclined relative to a horizontal dimension of the slot and is to make thermal contact with a complementary thermal exchange surface of the power supply unit when the power supply unit is received by the slot, the complementary thermal exchange surface also being inclined relative to a horizontal dimension of the slot. The cooling loop is thermally coupled to the first interface through which liquid coolant is to flow.

In another example, a computing apparatus comprises: an enclosure; a slot defined within the enclosure; an electrical power distribution subsystem disposed within the enclosure; a liquid-cooling subsystem disposed within the enclosure; and a pluggable power supply unit. The electrical power distribution subsystem is disposed within the enclosure and includes a first plurality of electrical connectors positioned in the slot. The liquid-cooling subsystem further includes: a plurality of liquid conduits through which a liquid coolant may circulate in operation; and a cold plate flexibly positioned within the slot, connected to the liquid conduits, and defining a first thermal exchange surface inclined relative to a horizontal, longitudinal dimension of the slot. The pluggable power supply unit is inserted into the slot and defines a complementary thermal exchange surface that engages the first thermal exchange surface as the pluggable power supply is inserted into the slot. The pluggable power supply unit thereby defines a wedge-shaped interface between the pluggable power supply unit and the liquid-cooling subsystem. The pluggable power supply also includes a second plurality of electrical connectors to mate with the first plurality of electrical connectors when the pluggable power supply unit is inserted into the slot.

In still other examples, a pluggable computing apparatus power supply unit, comprises a case, a printed circuit board, a plurality of heat-generating components, a thermal potting material, and a plurality of electrical connectors. The case defines a complementary thermal exchange surface, the complementary thermal exchange surface having an interior side. The printed circuit board is disposed within the case and the heat-generating components populate the printed circuit board on a side facing an interior side of the complementary thermal exchange surface. The thermal potting material is deposited over the heat-generating components in a conformal layer and fills the ullage between the printed circuit board and the interior side of the complementary thermal exchange surface. The plurality of electrical connectors are mounted to an end of the case through which the power supply unit may provide electric signals generated by the heat-generating components populating the printed circuit board.

Illustrative examples of the subject matter claimed below will now be disclosed. In the interest of clarity, not all features of an actual implementation are described in this specification. It will be appreciated that in the development of any such actual example, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

FIG. 1 is a rear perspective view of a pluggable computing apparatus power supply unit 100 in accordance with one or more examples. The power supply unit 100 includes a case 105 that defines a complementary thermal exchange surface 110. The complementary thermal exchange surface 110 is, more particularly, an inclined surface of an angled heat sink 115. It is "complementary" in the sense that it complements a thermal exchange surface of a cooling plate as will be described further below.

The power supply unit 100 is designed to be inserted into a slot (not shown) in a manner described further below in a direction indicated by the arrow 120. The power supply unit 100 includes two ends 125, 130. The ends 125, 130 may be referred to as the "posterior" or "back" end 125 and the "anterior" or "front" end 130. The terms "posterior", "back", "anterior" and "front" as used herein are defined relative to the direction indicated by the arrow 120. Note that the end 125 of the case 105 includes a number of electrical connectors 135 of different kinds through which the power supply unit 100 may provide electric signals generated by the heat-generating components (not shown in FIG. 1) populating the printed circuit board (also not shown in FIG. 1) as discussed further below. Note also that the end 125 does not include either liquid connections or air vents. Although not shown, the end 130 may include, for example, light emitting diode ("LED") indicator lights, displays, etc. as well as handle(s) that may be used to load or unload the power supply unit 100 from a slot in an enclosure.

Figure 2A:
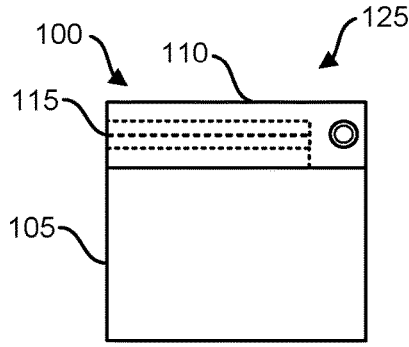
FIG. 2A-FIG. 2D are front, rear, bottom, and side plan views of the power supply unit of FIG. 1.
Figure 2B:
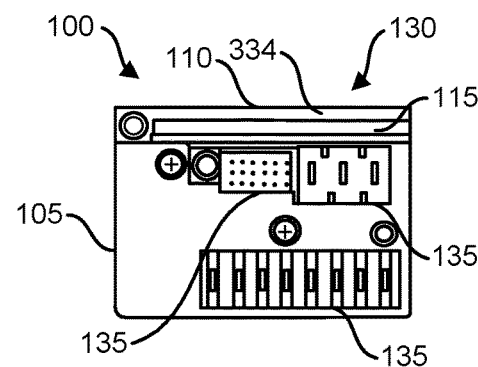
Figure 2C:
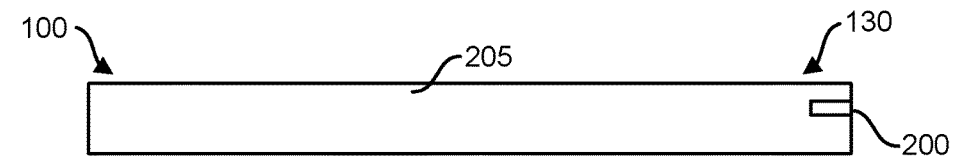
Figure 2D:
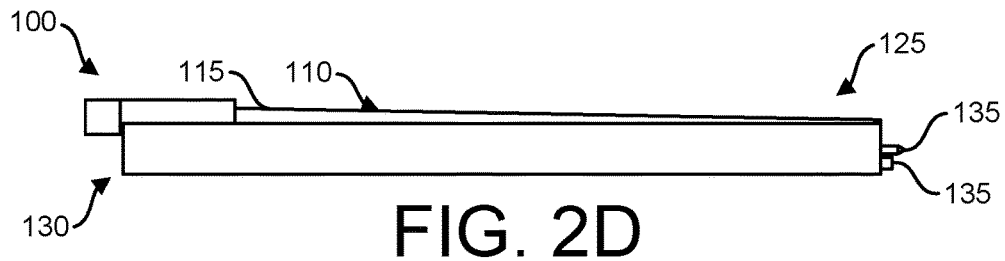

FIG. 2A-FIG. 2D are front, rear, bottom, and side plan views of the power supply unit 100 of FIG. 1. Note that some details regarding the function and appearance of the power supply unit 100 not material to the subject matter claimed below have been omitted for the sake of clarity. As is best shown in FIG. 2D, the complementary thermal exchange surface 110 is inclined relative to a horizontal dimension of the slot that is not shown in FIG. 2D. More particularly, the angled heat sink 115 is inclined at an angle of −0.7°. Note, however, that this is an implementation specific detail depending on the desired geometry of the power supply unit 100. Other examples my incline the angled heat sink 115 at greater or lesser angles.

Note that the thermal exchange surface 110 is defined by the geometry of the case 105. That is, the surface area, dimensions, and angle of the thermal exchange surface 110 are determined by the dimensions of the heat sink 115. FIG. 2C shows a keying slot 200 on the bottom 205 of the power supply unit 100. The keying slot 200 permits control over which power supply units are inserted into which slots. More particularly, different power supply units may include different keying slots that vary in some characteristic like size, shape, or location on the back of the power supply unit. Slots may similarly include keys (not shown) with varying characteristics selected to mate with particular power supply unit designs. If the keys and keying slots do not mate, then a given power supply unit cannot be inserted into a given slot. Conversely, if they do mate, then the power supply unit can be inserted into the slot. Note also that, as is apparent in FIG. 2A-FIG. 2B and FIG. 2D that the bottom 205 of the power supply unit 100 is substantially planar, or "flat" except for the keying slot 200.

Figure 3A:
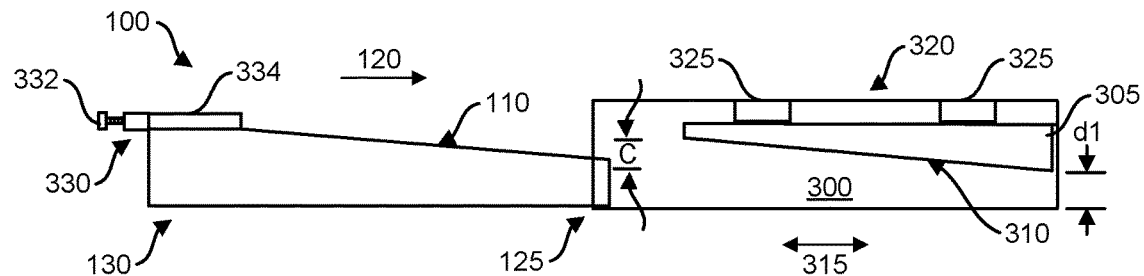
FIG. 3A-FIG. 3E illustrate a mating sequence by which the power supply unit of FIG. 1 and FIG. 2A
Figure 3B:
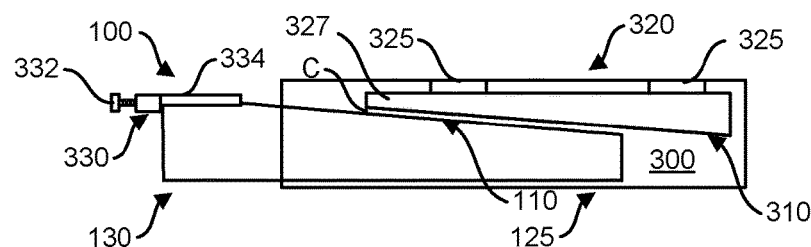
Figure 3C:
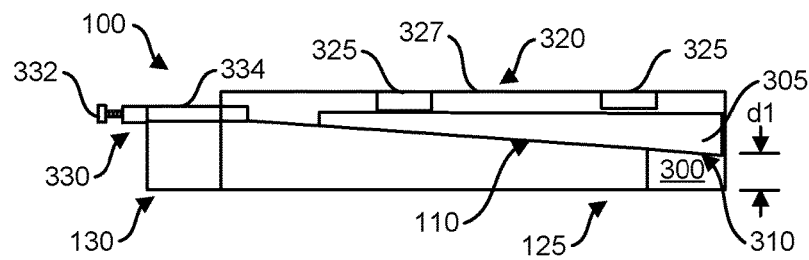

FIG. 3A-FIG. 3C illustrate an insertion sequence for the power supply unit 100 into a slot 300 in which a cold plate 305 is disposed. Some details of the power supply unit 100, the slot 300, and the cold plate 305 have been omitted in FIG. 3A-FIG. 3C so as not to clutter the present discussion. The cold plate 305 includes a thermal exchange surface 310. It is the thermal exchange surface 310 to which the complementary thermal exchange surface 110 is "complementary". The thermal exchange surface 310 and the complementary thermal exchange surface 110 are "complementary" in the sense that that are inclined relative to the horizontal dimension of the slot 300, indicated by the arrow 315 at a complementary angle.

Figure 3D:
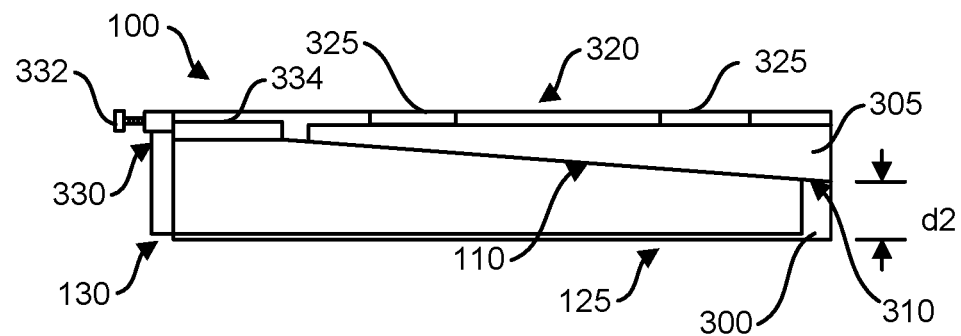
Figure 3E:
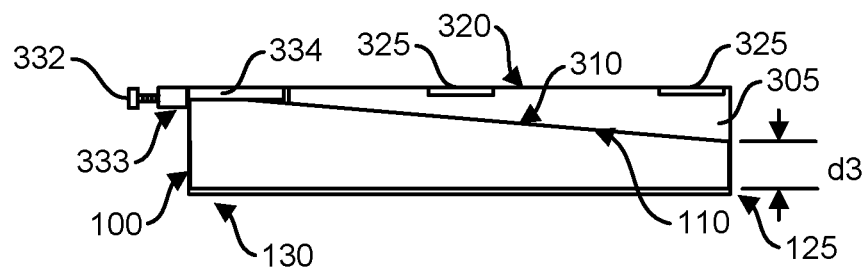

The cold plate 305 can define the thermal exchange surface 310 in one or more of several ways. The thermal exchange surface 310 is a face of the cold plate 305, and so the thermal exchange surface can be defined by the geometry of the cold plate 305. Note that, to this end, the cold plate 305 has a wedge-shaped profile when viewed from the side as in FIG. 3A-FIG. 3C just as does the power supply unit 100. However, the cold plate 305 also is a part of a cold plate assembly 320 only partially shown that may include one or more biasing elements 325 (e.g., springs). The biasing elements 325 operate against a shelf 327 defining the slot 300 to bias the cold plate 305 towards a first position shown in FIG. 3A. The first position corresponds to a neutral position, meaning the position that the biasing elements 325 force the cold plate 305 into when the power supply unit 100 is not installed. In the first position, the cold plate 305 is located such that the thermal exchange surface 310 interferes with the thermal exchange surface 110 as the power supply unit 100 is slid into the slot 300. That is, in the first position, various portions of the thermal exchange surface 310 are lower than corresponding portions of the thermal exchange surface 310 with which the various portions will ultimately interface. For example, the rear of the cold plate 305 may be a distance d1 from a bottom of the slot 300, where the distance d1 is smaller than a height of the back end 125 of the power supply unit 100. This ensures that the thermal exchange surface 310 will make solid contact with the thermal exchange surface 110 as the power supply unit 100 is inserted into the slot, regardless of variations from the expected dimensions resulting from manufacturing tolerances. The biasing elements 325 yield as the thermal exchange surface 310 and the complementary thermal exchange surface 110 engage as shown in FIGS. 3C-3E and the mechanical engagement overcomes (e.g., compresses) the biasing elements 325 allowing the cold plate to move into a second position. The compression of the biasing elements 325 may cause the biasing elements 325 to apply a downward force on the cold plate 305, thus generating a contact pressure between the cold plate 305 and the power supply unit 100 which may improve the thermal exchange therebetween. The biasing elements 325 serve several functions, including resolution of tolerances and to ensure that the complementary thermal exchange surface 110 and the thermal exchange surface 310 make line-to-line contact.

Thus, like the power supply unit 100 vis-à-vis the thermal exchange surface 110, the cold plate 305 can define the thermal exchange surface 310 through its geometry in some examples. In other examples, the cold plate 305 can define the thermal exchange surface 310 through positional deformation in addition to, or in lieu of, geometry. By positional deformation it is meant that the cold plate 305 is designed to move or change or shift position as it engages the power supply unit 100 through the operation of, for instance, the biasing elements 325.

Turning now specifically to FIG. 3A, the power supply unit 100 is inserted into the slot 300 by the end 125 first. The cold plate 305, as well as the rest of the cold plate assembly 320, is disposed within the slot 300 before the insertion begins. Furthermore, the biasing elements 325 have biased the cold plate 305 into the first position. As noted above, in the first position, the cold plate 305 is located so as to interfere with the power supply unit 100 as it is inserted into the slot, as illustrated in FIG. 3A with the rear of the cold plate 305 being a distance d1 from a bottom of the slot 300, where d1 is less than a height of the back end 125. Note that, because the cold plate 100 is not yet fully inserted into the slot 300 in FIG. 3A, there is a clearance C between the power supply unit 100 and the cold plate 305 at this stage.

Force is applied to the end 130 of the power supply unit 100 in the direction 315 (indicated in FIG. 1) to slide the power supply unit 100 further into the slot 100. As the power supply unit 100 slides into the slot 300, the clearance C decreases, as shown in FIG. 3B, until the thermal exchange surface 310 and the complementary thermal exchange surface 110 come into contact, as shown in FIG. 3C. Because the cold plate 305 is located so as to interfere with the power supply unit 100, the contact therebetween occurs before the power supply is fully inserted into o the slot. As the power supply unit 100 continues to be slid rearward into the slot 300 after initial contact has been made, the power supply unit 100 will begin to force the cold plate 305 upward, thus compressing the biasing elements 325, as shown in FIG. 3D (note how the rear end of the cold plate 305 is now a distance d2>d1 from the bottom of the slot 300). Further sliding of the power supply unit 100 rearward into the slot 300 ultimately results in the power supply unit 100 becoming fully installed in the slot and the cold plate 305 being forced by the power supply unit 100 into a second position, as shown in FIG. 3E (note how the rear end of the cold plate 305 is now a distance d3>d2 from the bottom of the slot 300).

The engagement between the power supply unit 100 and the cold plate 305 is a dry, metal-to-metal contact without any thermal interface material ("TIM"). The engagement therefore is not a thermal interface since the term "thermal interface" implies that there is some other material present besides just the metal thermal exchange surfaces. One example of "some other material" that might be found in a thermal interface is a TIM.

When the power supply unit is fully installed, the electrical connectors 135 (shown in FIG. 1) blind mate with electrical connectors (not shown) of the electrical subsystem that are positioned in the rear of the slot 300. This blind mating begins prior to the full mechanical engagement shown in FIG. 3E, for instance, blind mating may begin at the point of insertion illustrated in FIG. 3D. Note the presence of the air gap defined by the clearance C between the thermal exchange surface 310 and the complementary thermal exchange surface 110 that will diminish as the power supply unit 100 is inserted into the slot 300. Where used, the keying slot 200, shown in FIG. 2C, may also engage a key (not shown) also positioned in the slot 300.

Once the engagement is made as shown in FIG. 3E, a retention mechanism 330 may be actuated to secure the engagement. In this example, the retention mechanism 330 includes a jackscrew 332 driven through a guide 334 to threadably engage, for instance, the cold plate 305 or some part of the structure defining the slot 305. Although not shown, in some examples the retention mechanism 330 may employ a biasing element (e.g., a coil spring) to bias the jackscrew 332 in a first, extended position. The driving force applied to engage the jackscrew 332 can be used to first overcome the bias of the bias element before the threaded engagement is made. Conversely, when the jackscrew 332 is backed out of the threaded engagement, the bias element is no longer overcome and once again biases the jackscrew 332 in the first, extended position.

Still referring to FIG. 3E, note that the power supply unit 100 does not interact with the liquid-cooling subsystem of the computing apparatus other than through a dry, metal-to-metal contact with the cold plate 305 as described above without any thermal interface material ("TIM"). Accordingly, there are no liquid connections between the power supply unit 100. Nor are there any liquid coolant lines penetrating the power supply unit 100 such that no liquid enters the power supply unit 100. Note also that the power supply unit 100 interacts through a wedge-shaped mechanical contact with cold plate 305 of the liquid-cooling subsystem (not otherwise shown).

Figure 4A:
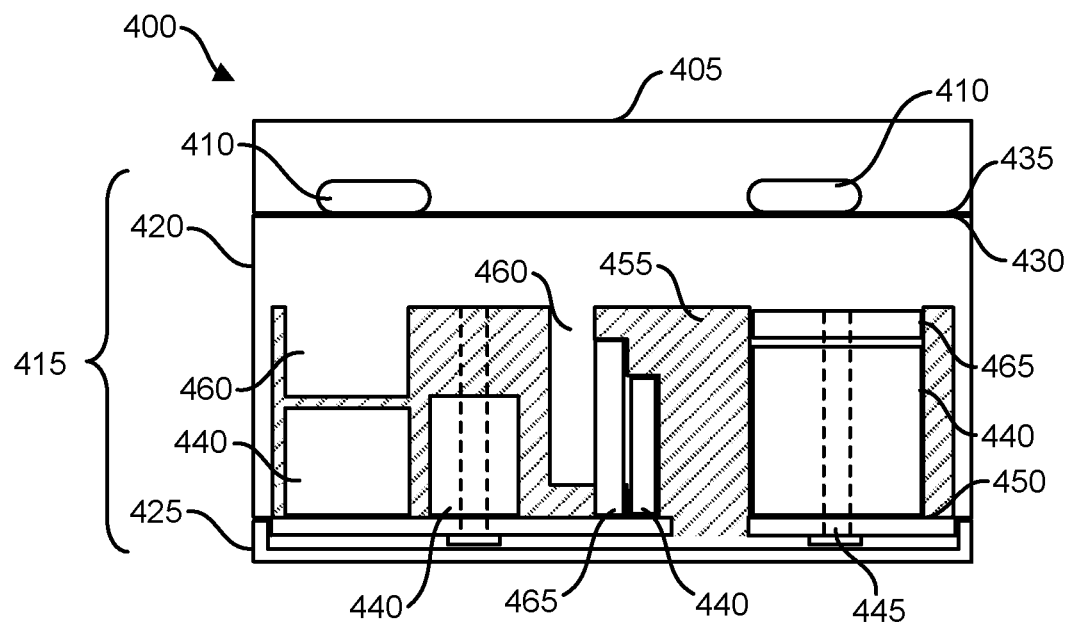
FIG. 4A is a sectioned view of an assembly including the power supply unit of FIG. 1 and FIG. 2A-FIG. 2D conceptually depicting the interior thereof.

The extraction of heat from the power supply unit 100 discussed above may be facilitated by the design of the power supply unit 100. FIG. 4A is a sectioned view of an assembly 400 including an example power supply unit 415. The example power supply unit 415 is one implementation of the power supply unit 100 of FIG. 1. In addition to the power supply unit 415, FIG. 4A also depicts a cooling plate 405 juxtaposed with the power supply unit 415 in the assembly 400. Note that the sectioning of the cooling plate 405 reveals a cooling loop 410 whose function will be described further below relative to one example of a cold plate assembly.

Figure 4B:
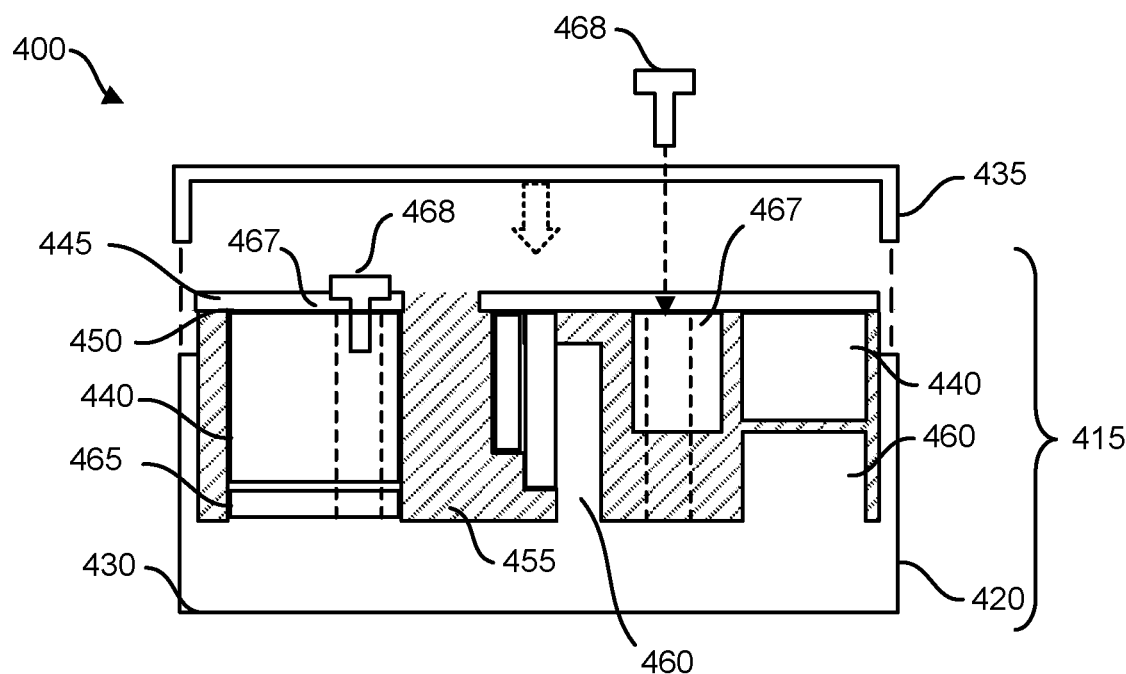
FIG. 4B conceptually illustrates one particular method for assembling the power supply unit of FIG. 4A.

FIG. 4A and FIG. 4B conceptually depict the interior of the power supply unit 415 and one particular method for assembling the same. The power supply unit 415 includes a heat sink 420 and a case 425. Note that the heat sink 420, in this particular example, is shown fabricated as a single part. In some examples, the heat sink 420 may be constructed from two or more parts. The heat sink 420 functions as a top or lid to the case 425. The heat sink 420 includes an inclined surface defining a complementary thermal exchange surface 430 that engages an inclined face of the cold plate 405 that defines a thermal interface 435. The engagement is a dry fit, metal-to-metal mechanical engagement without any TIM. In this respect, the heat sink 420 and case 425 of FIG. 4A are structurally and functionally equivalent to similar elements described above with respect to the power supply unit 100 of FIG. 1.

A plurality of heat-generating components 440 populate a printed circuit board 445 disposed in the power supply unit 415 as shown. The heat-generating components 440 may be a combination of low power components (e.g., 1-2 W), medium power components (e.g., 2-5 W), and high power components (e.g., >5-20 W) in terms of power consumption. There may also be other components (not shown) that do not consume power or whose power consumption is sufficiently low that they are not considered heat-generating components. The heat-generating components 440 populate the side 450 of the printed circuit board 445 facing the interior side 455 of the complimentary thermal exchange surface 430.

To facilitate heat transfer from the heat-generating components 440 to the heat sink 420, the ullage of the power supply unit 415 is filled, or at least substantially filled, with a thermal potting material 455 the thermal potting material 455 substantially fills the ullage and contacts both the heat generating components 440 and the interior side 450 of the complimentary thermal exchange surface 430. The thermal potting material 455 may be injected or poured into the power supply unit 415 as a conformal layer over the heat-generating components 440. As additional thermal potting material 455 is added it fills, or at least substantially fills, the ullage.

Those in the art having the benefit of this disclosure will appreciate that it is not unusual for thermal potting material 455 to shrink and create voids (not shown) as it cools. Such voids can be tolerated so long as the thermal potting material 455 substantially fills the ullage. However, effort should be taken to mitigate the presence of such voids using a vacuum chamber and/or a vibration table. Voids such as air pockets and bubbles should be removed either by minor vibration to "shake" the bubbles to rise to the top surface of the liquid thermal potting supply before it cures and/or by placing the assembly in a vacuum to further help bubbles evacuate.

The heat sink 420, in this particular example, includes a plurality of thermally conductive elements 460 projecting from the interior side 450 of the heat sink 420 into the ullage of the power supply unit 415. Using conductive elements 460 is optional and it may be used to help reduce the volume that is to be filled with the thermal potting material 455. This may also reduce the thickness of the thermal potting material 455, thereby reducing the formation of voids.

The heat sink 420, including the thermally conductive elements 460, and the case 425 may be constructed of a metal or some other sufficiently rigid material that is a good thermal conductor. In one example, the heat sink 420 and the case 425 are fabricated of anodized Aluminum. The manner in which the heat sink 420 and the case 425 are fabricated will be an implementation specific detail dependent upon, among other factors, the material chosen. The heat sink 420 and the case 425 may be, for instance, cast, machined, extruded, or even forged if the material is a metal. However, this list is neither exhaustive nor exclusive. Those in the art having the benefit of this disclosure may realize still other techniques that may be used to fabricate the heat sink 420 and the case 425.

Aluminum is a good thermal conductor, particularly relative to stainless steel, which is the material most commonly used for power supply unit cases. It is easily 5-10× as thermally conductive as steel. It is also, advantageously, less than half the density of steel. However, other materials may also be used. For example, Copper is also a good thermal conductor, although it is heavier than Aluminum and more challenging to manufacture.

Thus, when the heat sink 420 engages the cold plate 405, heat from the heat-generating components 440 is transferred through the thermal potting material 455, the thermally conductive elements 460, the walls of the case 425, and the heat sink 420 to the cold plate 405. The thermal potting material 455, the thermally conductive elements 460, the walls of the case 425 and the heat sink 420 define a thermal conductivity path) to the cold plate 405. This thermal conductivity path can be assisted with the use of a thermal interface material ("TIM") 465 between the heat-generating components 440 and the thermally conductive elements 460. Note, however, that in some examples there is no TIM in the engagement of the heat sink 420 and the cold plate 405.

Turning now to FIG. 4B, the power supply unit 400 may be assembled by first turning the heat sink 420 upside down on the thermal exchange surface 430. The printed circuit board 445, already populated with, for instance, the heat generating components 440, is then turned over so that it is upside down and placed over the heat sink 420. The heat sink 420 includes a plurality of standoffs 467 to which the printed circuit board 445 is secured using fasteners 468 or some other suitable technique. Thermal potting material 455 is then introduced in liquid form through openings 471 in the printed circuit 445 formed for this purpose. Once the thermal potting material 455 has cured, the case 425 is then also inverted and affixed to the heat sink 420. The affixation may be by, for instance, brazing, welding, bonding, adhering, fastening, or any other suitable technique. The assembled power supply unit 400 may then be returned right side up. Note that this assembly technique is an example only and that other examples may use other assembly techniques.

Figure 5:
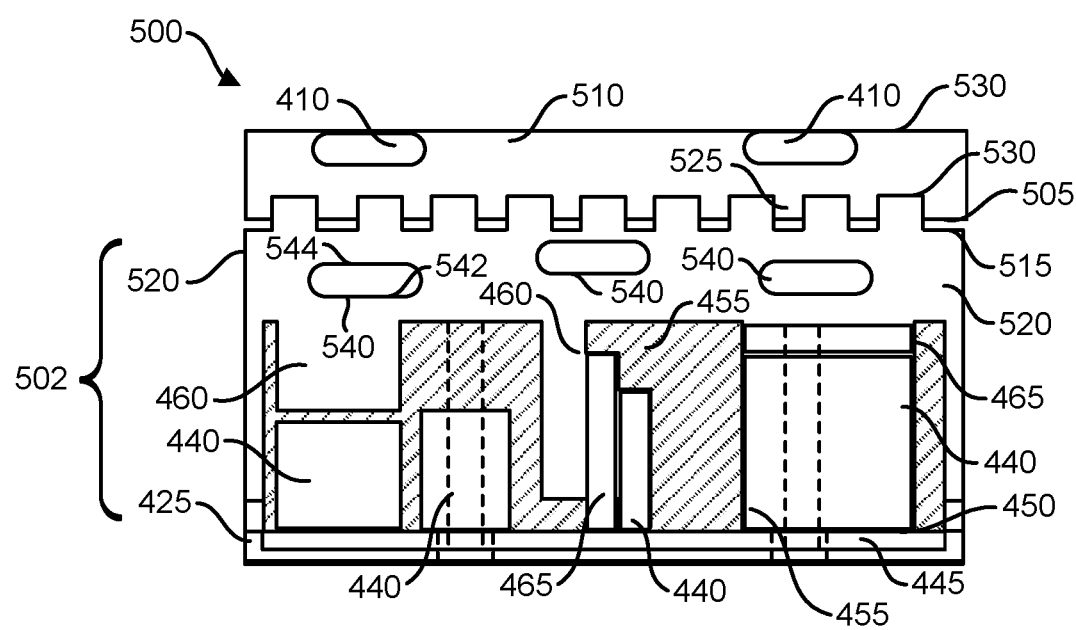
FIG. 5 is a sectioned view of another assembly including a power supply unit in accordance with one or more examples.

FIG. 5 illustrates an assembly 500 including another example power supply unit 502 in accordance with one or more examples. The assembly 500 of FIG. 5 includes many parts in common with the assembly 400 of FIG. 4A and like parts bear like numbers. There are at least two differences, however.

The first difference is that the thermal exchange surface 505 of the cold plate 510 and the complementary thermal exchange surface 515 of the heat sink 520 are both ribbed. The ribs 525, 530 (only one of each indicated) of the thermal exchange surface 505 and complementary thermal exchange surface 515 mate, mesh, or interleave when the cold plate 510 and heat sink 520 mechanically engage. The ribs 525, 530 increase the surface area over which heat transfer occurs and thereby increase the efficacy of heat extraction from the heat-generating components 440. Note that the cooling loop 410, in this example, has been relocated closer to the face 535 of the cold plate 510 than is the cooling loop 410 in the power supply unit 400 in FIG. 4A. Structures other than ribs performing this function may be used in other examples. For instance, some examples may use fins instead of ribs.

The second difference is that heat pipes 540 have been embedded in the heat sink 520. A "heat pipe" is a closed metal pipe, such as a copper pipe, containing a fluid coolant (not shown) that cycles between a liquid and a gas to perform heat transfer. Because the heat pipes 540 are closed, there is no need for liquid connections and they may be embedded as shown. As shown in FIG. 5, the heat pipes 540 need not necessarily have a circular cross-section. Also, the example in FIG. 5 includes three heat pipes 540 but other examples may have other numbers of heat pipes.

Each heat pipe 540 will have a "hot" side 542 and a "cold" side 544. The hot side 542 is on the side facing the heat-generating components 440 and the cold side 544 is the side facing the cold plate 510. When the fluid coolant is a liquid, it migrates by the force of gravity to the hot side 542. It then absorbs heat being transferred from the heat-generating components 440 through the heat sink 520 and vaporizes. Once vaporized, the gaseous coolant migrates to the cold side 544 whereupon the absorbed heat is transferred back to a colder region of the heat sink 520. The coolant then condenses to a liquid and migrates to the hot side 542 to repeat the cycle. Note that this process occurs along the entire length of the heat pipes 540 and that this length is not show in FIG. 5.

Furthermore, although not shown, in some examples the heat pipes 540 may be oriented or positioned so that they have a "hot end" and a "cold end". In these examples, the fluid coolant migrates as a vapor from the hot end to the cold end where it condenses and vice versa. The heat pipe 540 thereby transfers heat away from the heat generating components 440 along its length. This is generally considered more efficient than a "side-to-side" transfer described above. However, either the side-to-side transfer or the end-to-end transfer will permit the heat pipes to transfer heat load across a larger surface area than with the conductivity of the aluminum alone.

Thus, in accordance with the examples shown herein, a power supply unit 502 is liquid-cooled without penetration by liquid cooling lines such that the power supply unit is sealed against liquid penetration. This also eliminates the need for liquid connections between power supply unit and the cooling subsystem, thereby reducing issues arising from such liquid connections.

The power supply units disclosed herein are also "fanless"—that is, they do not contain any fans. This reduces electromagnetic interference ("EMI") that fans may introduce. Furthermore, because there is no fan there is no need for air vents. The absence of air vents, in addition to the metal construction of the case, helps to further suppress EMI that the components of the power supply unit might experience otherwise. Being fanless also removes a source of shock and vibration that may arise from fans.

In the examples set forth above, the cold plates may be a part of a cold plate assembly. Furthermore, in many computing apparatus, there may be multiple power supply units to power other computing devices of a computing apparatus. Thus, in examples using multiple power supply units, the cooling subsystem may also include multiple cold plate assemblies.

Figure 6:
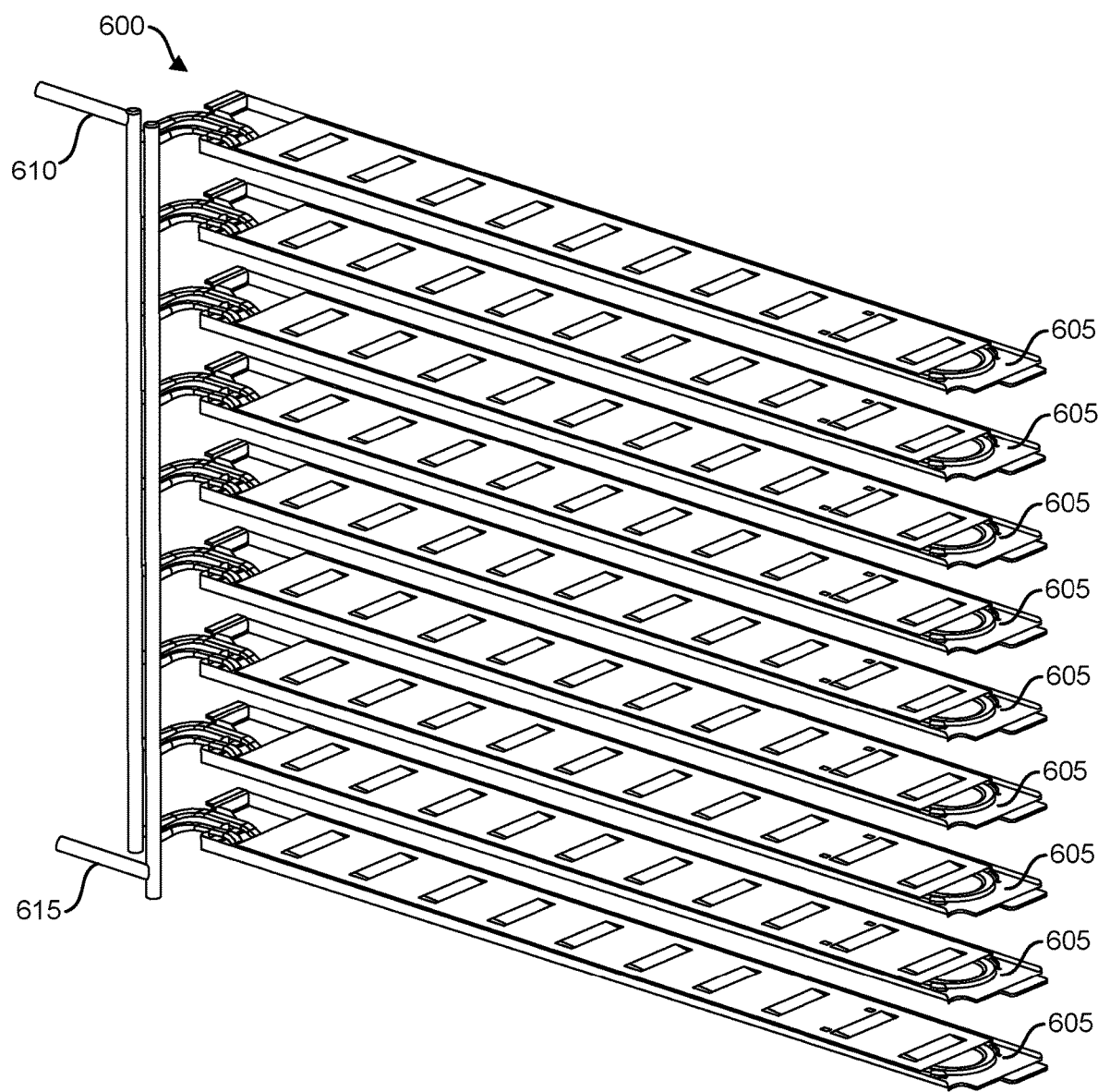
FIG. 6 depicts selected portions of a liquid-cooling subsystem including multiple cold plate assemblies in a perspective view in accordance with one or more examples.

FIG. 6 depicts selected portions of a liquid-cooling subsystem 600 including multiple cold plate assemblies 605 in accordance with one or more examples. The liquid-cooling subsystem 600 further includes a pair of liquid conduits—namely, a supply line 610 and a return line 615 through which a liquid coolant (not otherwise shown) is circulated to and from the cold plate assemblies 605. More particularly, the liquid-cooling subsystem 600 includes pumps (not shown) for circulating the liquid coolant therethrough as well as components (not shown) that cool the circulating liquid coolant.

The cold plate assemblies 605 may each be disposed in an individual slot (not shown) as described above. Individual power supply units (also not shown) will be inserted into the slots to engage the cold plate assemblies 605, also as described above. The cooled liquid coolant circulates to the individual cold plate assemblies 605 through the supply line 610 and through the cold plate assemblies 605. The cold plate assemblies 605 extract heat from the power supply units as described above. The heated liquid coolant then circulates away from the cold plate assemblies 605 through the return line 615. The liquid coolant is then cooled again and the cycle repeats.

Figure 7A:
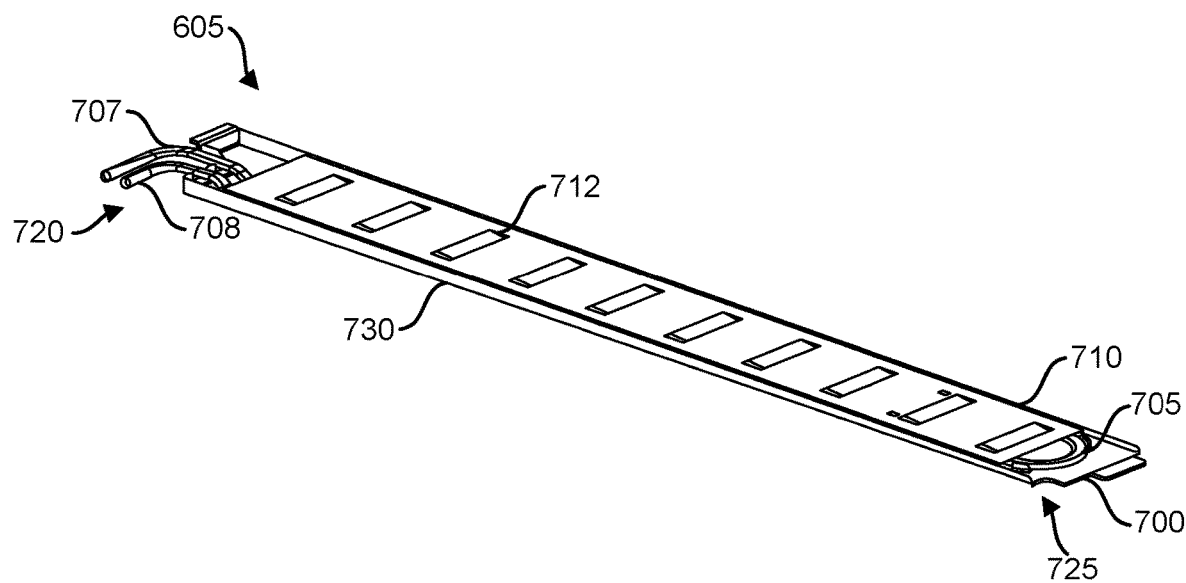
FIG. 7A-FIG. 7B are assembled and exploded perspective views of an individual cold plate assembly from the liquid-cooling subsystem of FIG. 6.
Figure 7B:
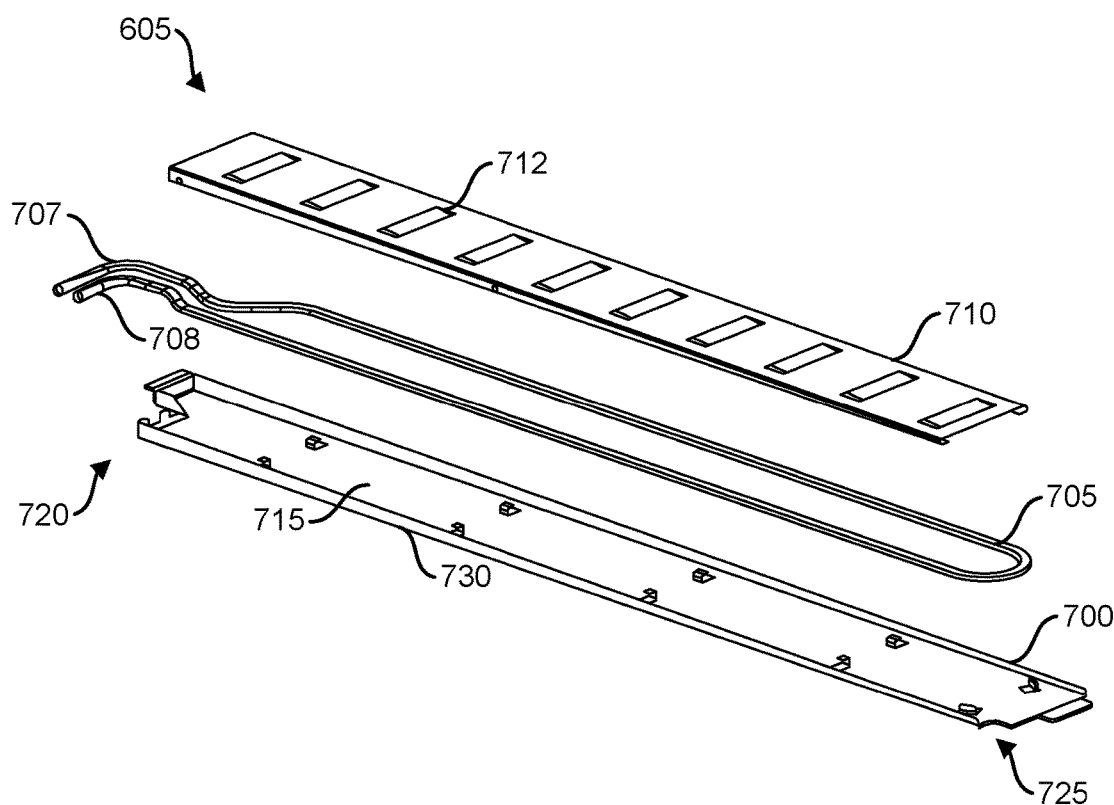

FIG. 7A-FIG. 7B are assembled and exploded perspective views, respectively, of an individual cold plate assembly 605 from the liquid-cooling subsystem 600 of FIG. 6. Referring to FIG. 7A and FIG. 7B collectively, the cold plate assembly 605 includes a Copper cold plate 700, a Copper cooling loop 705, and a stainless steel spring 710. The cold plate 700 defines a recess 715 in which the cooling loop 705 is positioned. The spring 710 is then placed over the cooling loop 705 and the recess 715 and affixed to the cold plate 700, e.g., by fasteners such as screws. The cooling loop 705 receives liquid coolant from the supply line 610, shown in FIG. 6, through its supply end 707 and returns the liquid coolant to the return line 615, also shown in FIG. 6, through its return end 708.

The spring 710 is one particular example of the biasing elements discussed above and includes a number of tabs 712 (only one indicated) extending therefrom. Different examples may use different numbers of tabs 712. Note the taper in the height of the cold plate 700 from the first end 720 to the second end 725. When the cold plate assembly 605 is positioned in the slot, the spring 710 will operate against the shelf (not shown) defining the slot. The taper in the height defines the angle of the thermal exchange surface 730 relative to the horizontal.

Figure 8:
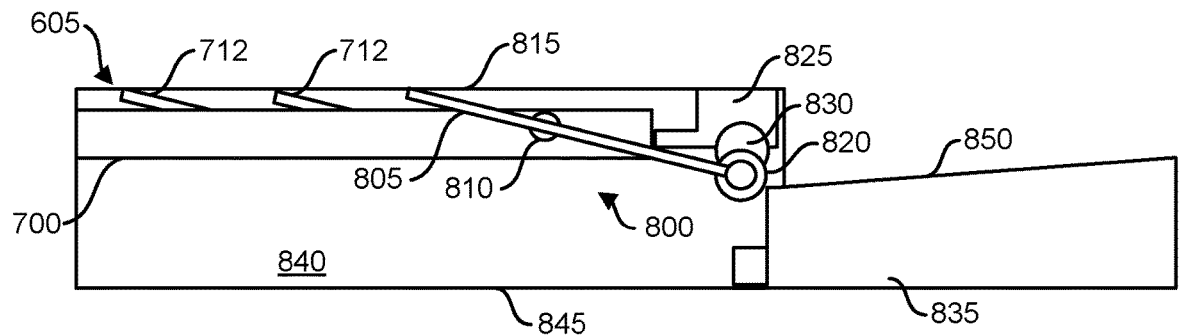
FIG. 8 conceptually depicts a surface cleaning system that may form a part of the cold plate assemblies of FIG. 6 in some examples.

Some examples of the cold plate assembly 605 in FIG. 6 may include a surface cleaning system. The performance of the dry thermal surface contact described herein relies on metal to metal contact. Foreign objects such as dirt can create prevent the proper or inefficient contact by creating air gaps. The surface cleaning system can prevent, or at least mitigate, this occurrence. FIG. 8 conceptually depicts a surface cleaning system 800 that may form a part of the cold plate assemblies 605 of FIG. 6 in some examples. Like parts of the cold plate assembly 605 in FIG. 8 relative to FIG. 6 and FIG. 7A-FIG. 7B are given like numbers.

The surface cleaning system 800 includes an arm 805 rotating about a pivot 810 and is biased in a first position shown in FIG. 8 by a torsion spring (not shown) at the pivot 810 and the operation of the arm 805 against 815. At the distal end of the arm 805 a cleaning roller 820 is rollably mounted. The cleaning roller 820 may include, for instance, a felt-like or micro fiber surface. An extension 825 defining a clearance pocket 830 is affixed to the end 725 of the cold plate 700.

As the power supply unit 835 is inserted into the slot 840 defined by the shelves 815, 845, it encounters the roller 820 as the arm 805 is extended in the first position as described above. The force of insertion forces the roller 820 onto the inclined face 850 of the power supply unit 835. The roller 820 rolls "up" the inclined face 850 as the power supply unit 835 is inserted into the slot 840. As the roller 820 rolls up the inclined face 850, it sweeps or cleans the inclined face of contaminants such as dust, etc. that might otherwise inhibit or interfere with the thermal coupling between the power supply unit 835 and the cold plate assembly 605.

As the clearance between the power supply unit 830 and the cold plate 700 narrows, the roller 820 rotates into the pocket 830. The roller 820 seats in the pocket 830 as the power supply unit 835 begins to mechanically engage the cold plate assembly 605. As the insertion continues, the tabs 712 of the spring 710 (shown in FIG. 7A-FIG. 7B) operating against the shelf 815 to cause it to yield. Eventually, the insertion ends and the power supply unit 835 is fully mechanically engaged with the cold plate assembly 605.

The discussion above pertains to examples in which the cold plate (or cold plate assembly) is positioned at the "top" of the slot in which the power supply unit will be inserted. In this context, "top" and "bottom" may be defined relative to the pull of gravity, with the bottom being in the direction of the pull of gravity relative to the top. However, this vertical orientation may be different in other examples. In some examples, the cold plate may be position at the bottom of the slot. In these examples, since the thermal exchange surface of the power supply unit is complementary to the thermal exchange surface of the cold plate, the power supply unit is "inverted" relative to its orientation in the examples above.

Figure 9A:
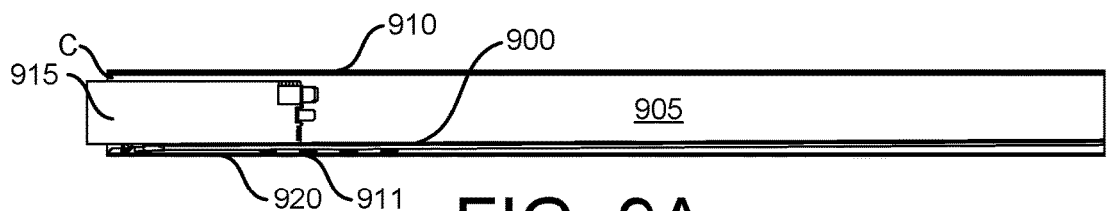
FIG. 9A-FIG. 9C illustrate a mating sequence as may be used in accordance with one or more examples.
Figure 9B:
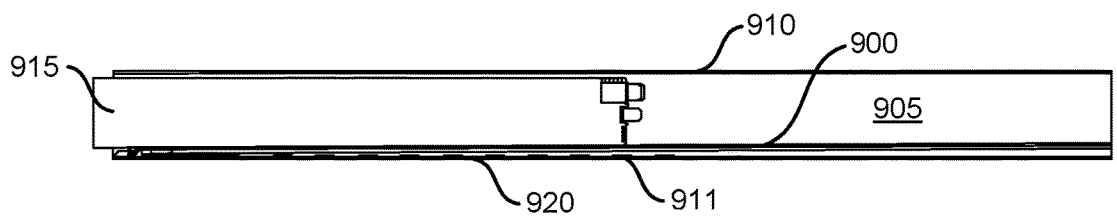
Figure 9C:
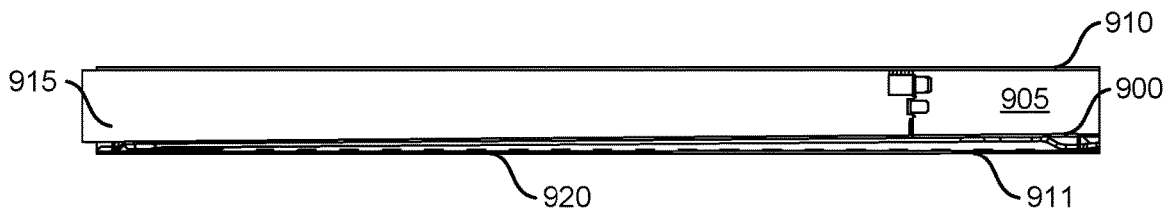

FIG. 9A-FIG. 9C illustrate a mating sequence as may be used in accordance with one such example. In this example, a cold plate assembly 900 is disposed in a slot 905 that is defined by two shelves 910, 911. The cold plate assembly 900 may be, for instance, a cold plate assembly 605 such as is shown FIG. 6 and FIG. 7A-FIG. 7B. A power supply unit 915 is shown being inserted progressively from FIG. 9A to FIG. 9C. The power supply unit 915 may be, for instance, any one of the power supply units 100, 415, 502 as shown in FIG. 1, FIG. 4A, or FIG. 5, respectively.

Note that the cold plate assembly 900 is disposed at the "bottom" of the slot 905 such that the biasing elements 920 (only one indicated) operate against the "floor" of the slot defined by the shelf 911. Because the cold plate assembly 900 is disposed on the floor, and because the thermal exchange surfaces 925, 930 of the cold plate assembly 900 and the power supply unit 915, respectively, are complementary, the power supply unit 915 is inserted in an inverted orientation relative to the insertion process of FIG. 3A-FIG. 3C.

The mechanical engagement between the power supply unit 915 and the cold plate assembly 900 begins with insertion. This leaves a clearance C between the "top" of the power supply unit 915 and the shelf 910 defining the "ceiling" of the slot 905 as shown in FIG. 9A. The clearance C decreases as the power supply unit 915 is inserted into the slot 905 as is shown in FIG. 9B. Eventually, as shown in FIG. 9C, the clearance C disappears and the force exerted by the shelf 910 against the power supply unit 915 begins to overcome the biasing elements 920. This firms the mechanical engagement between the power supply unit 915 and the cold plate assembly 900 until the power supply unit 915 is seated in the slot 905 and the electrical connections are made. In this example, the interaction between the power supply unit 915 and the cold plate assembly 900 is a wedge-shaped, dry, metal-to-metal contact without any thermal interface material ("TIM").

Thus, in various examples, the cold plate assembly may be positioned in the slot at the top, or ceiling, while the power supply unit is inserted in an "upright" orientation (e.g., as in FIG. 3A-FIG. 3C). In other examples, the cold plate assembly may be positioned at the bottom, or floor, of the slot while the power supply unit is inserted in an "inverted" position (e.g., as in FIG. 9A-FIG. 9C). In still other examples, these approaches may be combined.

Figure 10A:
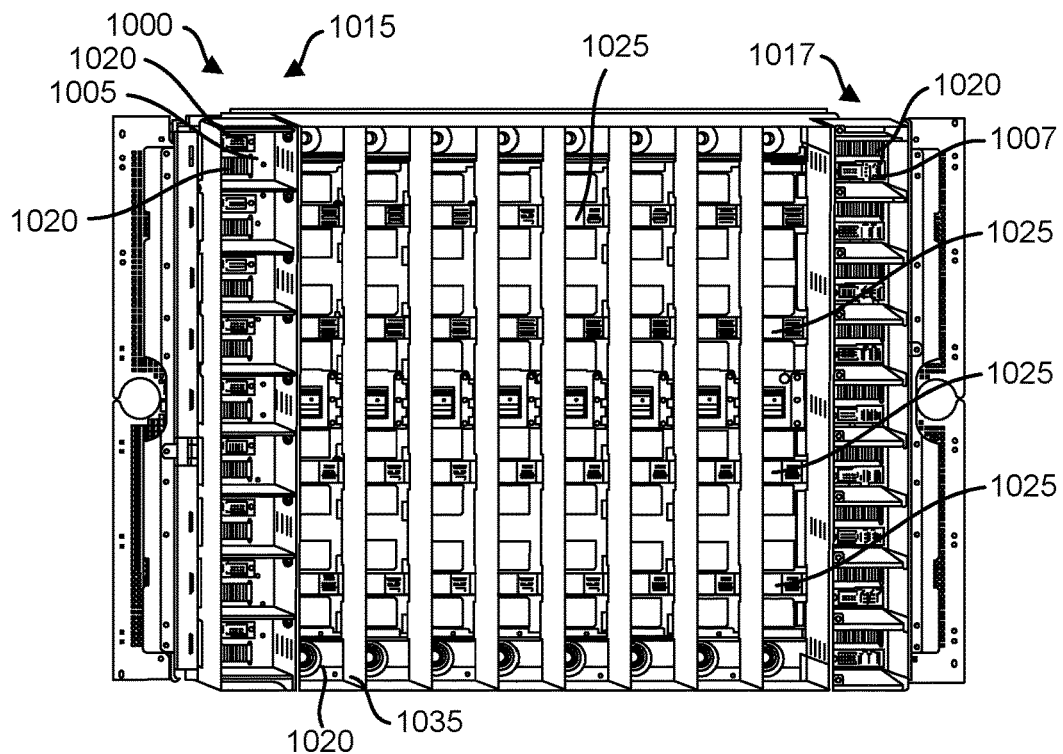
FIG. 10A-FIG. 10C depict an enclosure in which slots have been defined and having cooling plate assemblies such as those of FIG. 7A-FIG. 7B disposed within the slots.
Figure 10B:
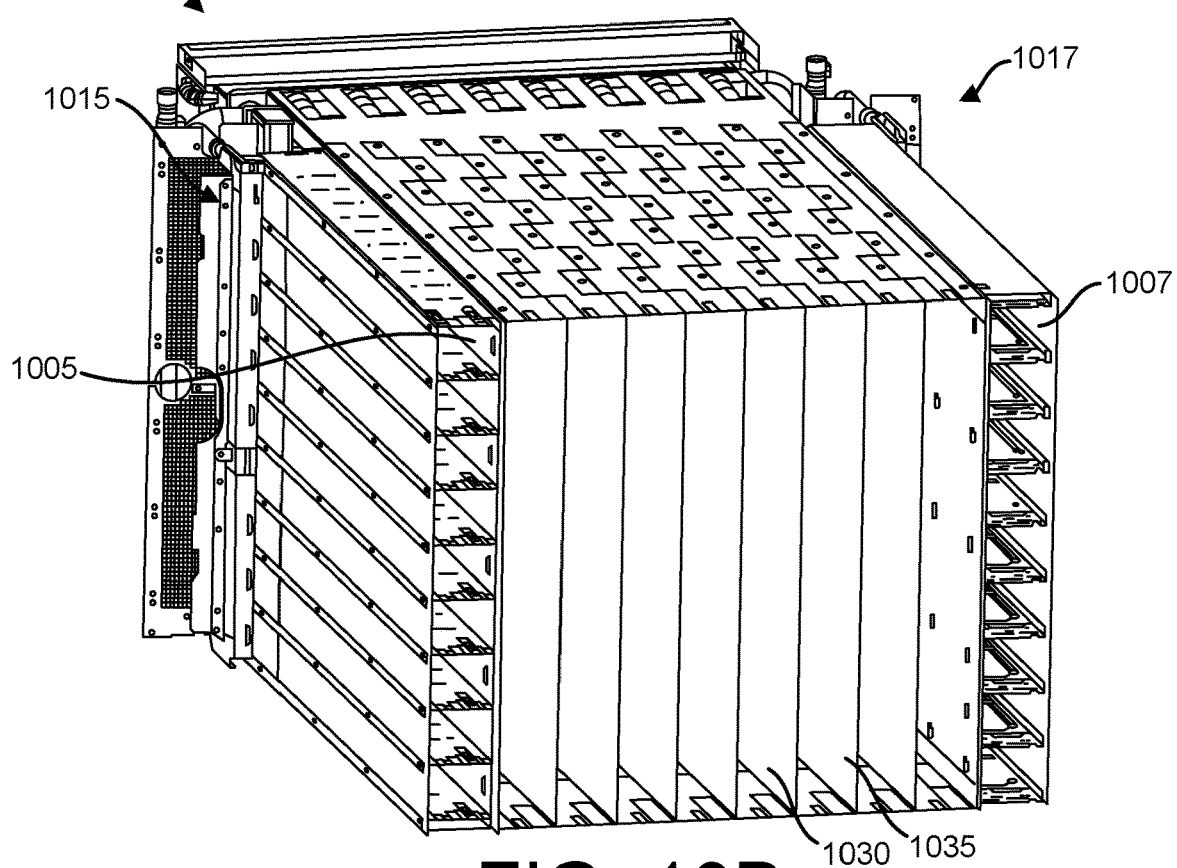
Figure 10C:
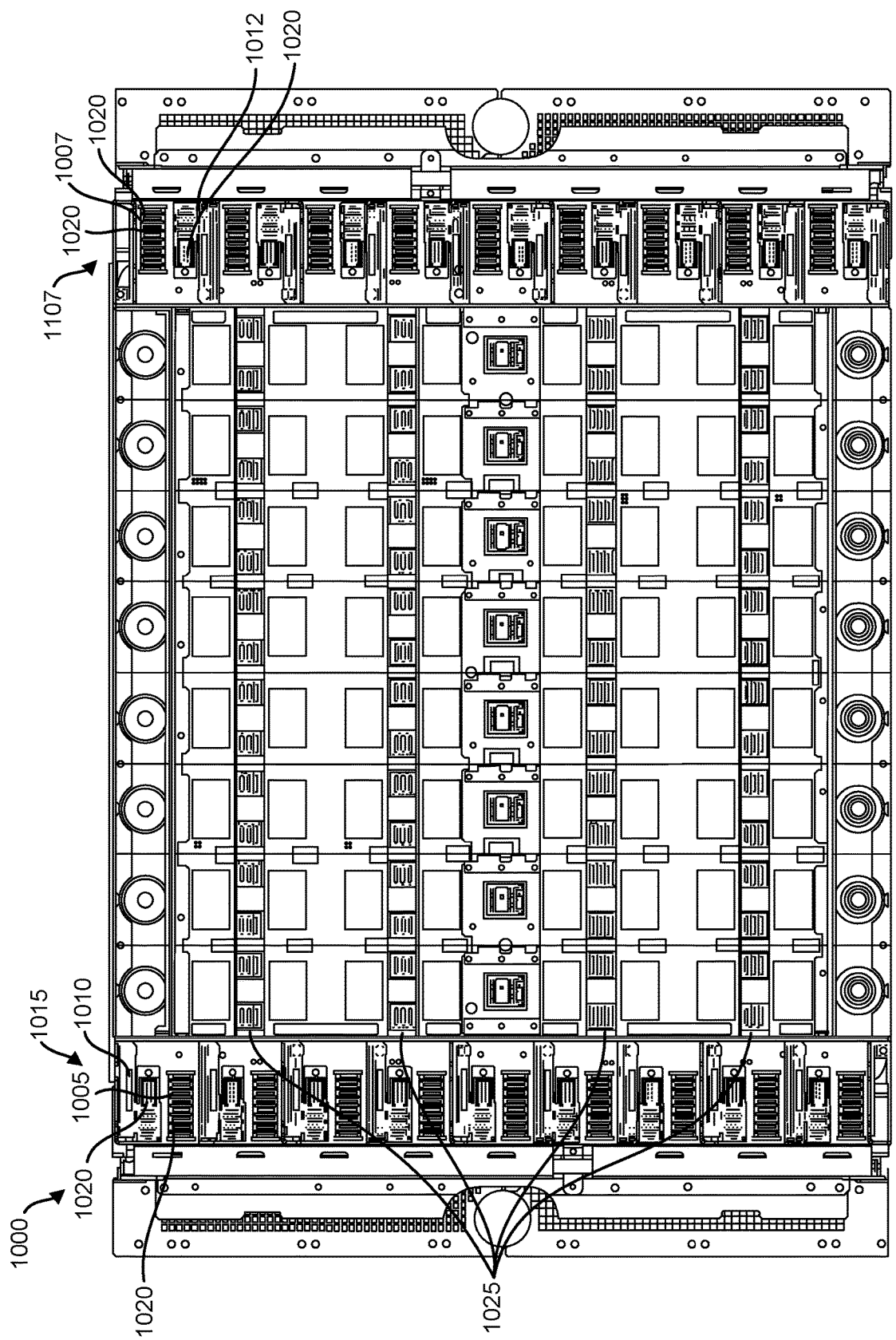

FIG. 10A-FIG. 10C depict an enclosure 1000 in which slots 1005, 1007 (only one of each designated) have been defined as having cooling plate assemblies 1010, 1012 disposed within the slots 1005, 1007, such as those of FIG. 7A-FIG. 7B. FIG. 10A and FIG. 10B are perspective views of the enclosure 1000 from the front thereof, but from two different perspectives. FIG. 10C is a plan view from the front of the enclosure 1000.

The slots 1005, 1007 are part of respective subassemblies 1015, 1017 of the enclosure 1000. Each subassembly 1015, 1017 includes a column of slots 1005, 1007, respectively. Each slot 1005, 1007 includes a plurality of electrical connectors 1020 positioned in each slot 1005, 1007 that, along with the power bus bar 1025, constitute a portion of the electrical subsystem (not otherwise shown) for the enclosure 1000. There are no liquid connections for the power supply unit (not shown) in the slots 1015, 1017.

Each slot 1005, 1007 includes a cold plate assembly 1030. The cold plate assemblies 1030 may be, for instance, the cold plate assembly 605 of FIG. 7A-FIG. 7B. Note that the cold plate assemblies 1030 are positioned at the top of the slots 1005 and at the bottom of the slots 1007. Thus, the power supply units (not shown) will be inserted into the slots 1005 in an "upright" orientation as in FIG. 3A-FIG. 3C and inserted into the slots 1007 in an "inverted" orientation as in FIG. 9A-FIG. 9C.

Figure 11A:
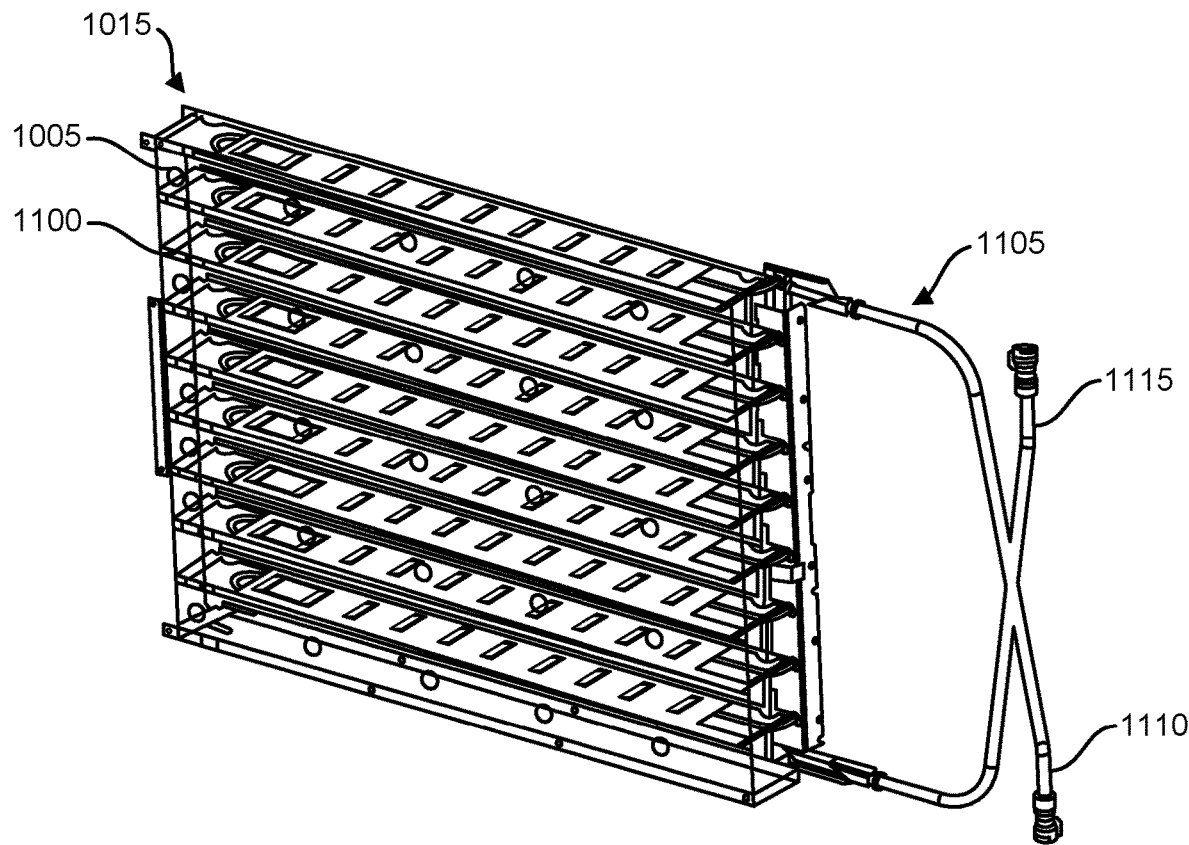
FIG. 11A-FIG. 11B depict a subassembly of the enclosure of FIG. 10A-FIG. 10C in perspective views from two different perspectives and in isolation.
Figure 11B:
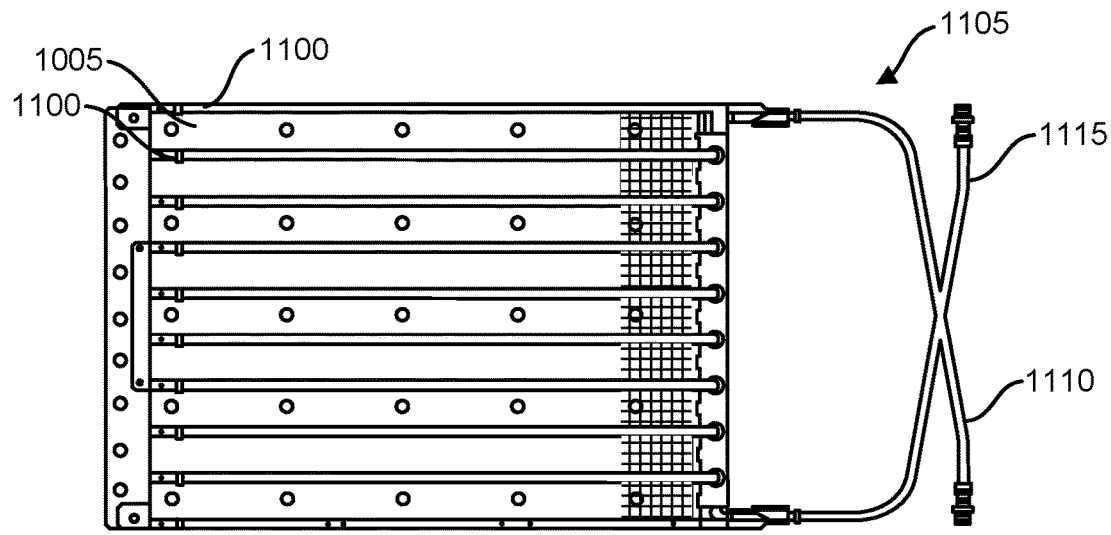

The liquid connections between the cold plate assemblies 1030 in the slots 1005 of the subassembly 1015 are shown in FIG. 11A-FIG. 11B. These drawings present a perspective view from the back or rear and a side view, respectively, of a subassembly 1015. Note that each slot 1005 (only one indicated) is defined by one or more shelves 1100 (only one indicated). The back plate has been removed so that the pertinent portions of the cooling loop 1105 of the cooling subsystem (not otherwise shown) is more visible. More particularly, the cooling loop 1105 includes a pair of liquid conduits-namely, a supply line 1110 and a return line 1115, each of which is vertically disposed at the back of the slots 1005.

In the illustrated example, the cold plate assemblies 1015 are implemented with the cold plate assemblies 605 best shown in FIG. 7A-FIG. 7B. As shown therein, the cold plate assembly 605 includes a cooling loop 705 having a supply end 707 and return end 708. Returning to FIG. 11A-FIG. 11B, the supply line 1110 and return line 1115 of the cooling loop 1105 runs vertically through each of the shelves 1100 adjacent to the cold plate assemblies 1015. The cooling loops of the cold plate assemblies 1015 (e.g., cooling loops 704) make a liquid connection with the supply line 1110 and return line 1115 to circulate liquid coolant therethrough and, in operation, cool the power supply units (not shown).

Returning now to FIG. 10A-FIG. 10C, the enclosure 1000 further includes a plurality of bays 1030 defined by a plurality of vertically disposed partitions 1035 (only one of each designated). The bays 1030 are intended to host a plurality of computing devices such as, without limitation, switches, router, servers, etc., that are not shown. In some examples, the computing devices may function as computing nodes in operation. It is these computing devices to which the power supply units hosted in the slots 1005, 1007 will provide power. There typically will not be a one-to-one correspondence between the power supplies and the computing devices although there may be in some examples. Furthermore, the manner in which the electrical and cooling subsystems of the enclosure 1000 interact with the computing devices may be different from the manner in which they interact with the power supply units as well as different from one another.

This concludes the detailed description. The particular examples disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular examples disclosed above may be altered or modified and all such variations are considered within the scope and spirit of the invention. Accordingly, the protection sought herein is as set forth in the claims below.

The invention claimed is:

1. A computing apparatus, comprising: an enclosure to house computing nodes; a slot to receive a power supply unit that is to provide power to the computing nodes; and a cold plate assembly positioned in the slot and comprising: a first thermal exchange surface inclined relative to a horizontal dimension of the slot to make thermal contact with a complementary thermal exchange surface of the power supply unit when the power supply unit is received by the slot, the complementary thermal exchange surface also being inclined relative to a horizontal dimension of the slot, and a cooling loop thermally coupled to the first thermal exchange surface and through which liquid coolant is to flow.

2. The computing apparatus of claim 1, wherein the cold plate assembly further comprises a biasing element to bias the cold plate in a first position and yields as the first thermal exchange surface and complementary thermal exchange surface engage.

3. The computing apparatus of claim 1, wherein:
the cold plate assembly includes a cold plate that defines the first thermal exchange surface; and
the cold plate assembly includes a cleaning system to clean the complementary inclined surface as the power supply unit is inserted into the slot.

4. The computing apparatus of claim 3, wherein:
the cold plate defines a clearance pocket; and
the cleaning system includes:
a pivotable arm mounted to the cold plate biased in a first position; and
a roller mounted to an anterior end of the pivotable arm that engages the complementary thermal exchange surface as a power supply unit is inserted into the slot and retreats into the clearance pocket as the power supply unit is inserted into the slot.

5. The computing apparatus of claim 1, wherein the cold plate assembly includes:
a cold plate defining the first thermal exchange surface on a first side thereof and having a second side;
a biasing element to bias the cold plate in a first position and yields as the first thermal exchange surface and complementary thermal exchange surface engage; and
wherein:
the liquid cooling loop is encased between the second side of the cold plate and the biasing element.

6. The computing apparatus of claim 1, wherein the power supply unit, the pluggable power supply unit further comprises a case defining the complementary thermal exchange surface through the geometry of the case, the complementary thermal exchange surface engaging the first the first thermal exchange surface in a wedge-shaped, dry fit, metal-to-metal engagement.

7. The computing apparatus of claim 1, wherein the first thermal exchange surface includes a first plurality of fins or ribs extending into the slot to mate with a second plurality of fins or ribs extending into the slot from the complementary thermal exchange surface.

8. The computing apparatus of claim 1, wherein there are no fans within the power supply unit.

9. A computing apparatus, comprising:
an enclosure;
a slot defined within the enclosure;
an electrical power distribution subsystem disposed within the enclosure and including a first plurality of electrical connectors positioned in the slot;
a liquid-cooling subsystem disposed within the enclosure and including:
   a plurality of liquid conduits through which a liquid coolant circulates in operation; and
   a cold plate positioned within the slot, connected to the liquid conduits, and defining a first thermal exchange surface inclined relative to a horizontal dimension of the slot; and
a pluggable power supply unit inserted into the slot, the pluggable power supply unit defining a complementary thermal exchange surface that engages the first thermal exchange surface as the pluggable power supply is inserted into the slot to define a wedge-shaped interface between the pluggable power supply unit and the liquid-cooling subsystem, the pluggable power supply including a second plurality of electrical connectors to mate with the first plurality of electrical connectors when the pluggable power supply unit is inserted into the slot.

10. The computing apparatus of claim 9, wherein the pluggable power supply unit, comprises:
a case defining the complementary thermal exchange surface, the complementary thermal exchange surface having an interior side;
a printed circuit board disposed within the case;
a plurality of heat-generating components populating the printed circuit board and facing an interior side of the complementary thermal exchange surface;
a thermal potting material deposited over the heat-generating components in a conformal layer and substantially filling the ullage between the printed circuit board and the interior side of the complementary thermal exchange surface; and
a plurality of electrical connectors mounted to the posterior end through which the power supply unit may provide electric signals generated by the heat-generating components populating the printed circuit board.

11. The computing apparatus of claim 9, wherein the cold plate comprises a part of a cold plate assembly, the cold plate assembly further comprising a biasing element to bias the cold plate in a first position and yield as the first thermal exchange surface and complementary thermal exchange surface engage.

12. The computing apparatus of claim 9, wherein the cold plate comprises a part of a cold plate assembly, the cold plate assembly further comprising a cleaning system to clean the complementary inclined surface as the power supply unit is inserted into the slot.

13. The computing apparatus of claim 12, wherein: the cold plate defines a clearance pocket; and the cleaning system includes: a pivotable arm mounted to the cold plate biased in a first position; and a roller mounted to an anterior end of the pivotable arm that engages the complementary thermal exchange surface as the heat-generating component is inserted into the slot and retreats into the clearance pocket as the pluggable, heat-generating component is inserted into the slot.

14. The computing apparatus of claim 9, wherein the cold plate defines the first thermal exchange surface on a first side, includes a second side, and comprises a part of a cold plate assembly, the cold plate assembly further comprising:
a biasing element to bias the cold plate in a first position and yield as the first thermal exchange surface and complementary thermal exchange surface engage; and
a liquid cooling loop encased between the second side of the cold plate and the biasing element.

15. The computing apparatus of claim 9, wherein the pluggable power supply unit comprises a case and defines the complementary thermal exchange surface through the geometry of the case.

16. The computing apparatus of claim 9, wherein the first thermal exchange surface includes a first plurality of fins or ribs extending into the slot to mate with a second plurality of fins or ribs extending into the slot from the complementary thermal exchange surface.

17. The computing apparatus of claim 9, wherein the thermal exchange surface has an exterior side and includes a plurality of fins or ribs extending from the exterior side.

18. The computing apparatus of claim 9, wherein the pluggable power supply unit is fanless.

19. The computing apparatus of claim 18, wherein the pluggable power supply unit:
is sealed against fluid penetration; and
is not penetrated by any liquid coolant lines.

20. The computing apparatus of claim 9, wherein the pluggable power supply unit:
is sealed against fluid penetration; and
is not penetrated by any liquid coolant lines.

21. A pluggable power supply unit for use in a computing apparatus, comprising: a case defining a complementary thermal exchange surface inclined relative to a horizontal axis of the case, the complementary thermal exchange surface having an interior side; a printed circuit board disposed within the case; a plurality of heat-generating components populating the printed circuit board on a side facing the interior side of the complementary thermal exchange surface; a thermal potting material deposited over the heat-generating components in a conformal layer and filling the ullage between the printed circuit board and the interior side of the complementary thermal exchange surface; and a plurality of electrical connectors mounted to an end through of the case through which the power supply unit may provide electric signals generated by the heat-generating components populating the printed circuit board.

22. The pluggable power supply unit of claim 21, wherein the case is constructed of aluminum.

23. The pluggable power supply unit of claim 22, wherein the aluminum is anodized.

24. The pluggable power supply unit of claim 21, wherein the interior side includes a plurality of thermally conductive elements projecting into the ullage of the case.

25. The pluggable power supply unit of claim 21, wherein the thermal exchange surface has an exterior side and includes a plurality of fins or ribs extending from the exterior side.

26. The pluggable power supply unit of claim 21, wherein the pluggable computing apparatus is fanless.

27. The pluggable power supply unit of claim 23, wherein the pluggable computing apparatus:
   is sealed against fluid penetration; and
   is not penetrated by any liquid coolant lines.

28. The pluggable power supply unit of claim 21, wherein the pluggable computing apparatus:
   is sealed against fluid penetration; and
   is not penetrated by any liquid coolant lines.

\* \* \* \* \*